United States Patent
More et al.

(10) Patent No.: US 12,142,663 B2
(45) Date of Patent: *Nov. 12, 2024

(54) METHOD FOR FORMING SOURCE/DRAIN CONTACTS

(71) Applicant: TAIWAN SEMICONDUCTOR MANUFACTURING CO., LTD., Hsinchu (TW)

(72) Inventors: Shahaji B. More, Hsinchu (TW); Chun Hsiung Tsai, Hsinchu County (TW); Shih-Chieh Chang, Taipei (TW); Kuo-Feng Yu, Hsinchu County (TW); Cheng-Yi Peng, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/357,823

(22) Filed: Jul. 24, 2023

(65) Prior Publication Data

US 2023/0369451 A1   Nov. 16, 2023

Related U.S. Application Data

(60) Continuation of application No. 16/871,882, filed on May 11, 2020, now Pat. No. 11,769,817, which is a
(Continued)

(51) Int. Cl.
*H01L 29/78* (2006.01)
*H01L 21/02* (2006.01)
(Continued)

(52) U.S. Cl.
CPC ...... *H01L 29/665* (2013.01); *H01L 21/02667* (2013.01); *H01L 21/26513* (2013.01);
(Continued)

(58) Field of Classification Search
CPC ......... H01L 29/08; H01L 29/45; H01L 29/66; H01L 29/78; H01L 29/161; H01L 29/165;
(Continued)

(56) References Cited

U.S. PATENT DOCUMENTS

| 8,772,109 B2 | 7/2014 | Colinge |
| 8,785,285 B2 | 7/2014 | Tsai et al. |

(Continued)

FOREIGN PATENT DOCUMENTS

KR   20090091729   8/2009

OTHER PUBLICATIONS

Koh, Shao-Ming et al., "Method for Source/Drain Contact Formation in Semiconductor Devices", U.S. Appl. No. 15/686,698, filed Aug. 25, 2017, 38 pages.
(Continued)

*Primary Examiner* — Chuong A Luu
(74) *Attorney, Agent, or Firm* — HAYNES AND BOONE, LLP

(57) ABSTRACT

A semiconductor structure includes a substrate, a semiconductor fin extending from the substrate, and a silicon germanium (SiGe) epitaxial feature disposed over the semiconductor fin. A gallium-implanted layer is disposed over a top surface of the SiGe epitaxial feature, and a silicide feature is disposed over and in contact with the gallium-implanted layer.

20 Claims, 12 Drawing Sheets

Related U.S. Application Data division of application No. 16/211,451, filed on Dec. 6, 2018, now Pat. No. 10,651,287, which is a continuation of application No. 15/904,502, filed on Feb. 26, 2018, now Pat. No. 10,164,048.

(60) Provisional application No. 62/592,032, filed on Nov. 29, 2017.

(51) Int. Cl.

| | | |
|---|---|---|
| *H01L 21/265* | (2006.01) | |
| *H01L 21/285* | (2006.01) | |
| *H01L 21/311* | (2006.01) | |
| *H01L 21/324* | (2006.01) | |
| *H01L 21/768* | (2006.01) | |
| *H01L 21/8234* | (2006.01) | |
| *H01L 29/08* | (2006.01) | |
| *H01L 29/165* | (2006.01) | |
| *H01L 29/167* | (2006.01) | |
| *H01L 29/417* | (2006.01) | |
| *H01L 29/45* | (2006.01) | |
| *H01L 29/66* | (2006.01) | |
| *H01L 21/3105* | (2006.01) | |
| *H01L 29/161* | (2006.01) | |

(52) U.S. Cl.
CPC .. *H01L 21/28518* (2013.01); *H01L 21/31111* (2013.01); *H01L 21/324* (2013.01); *H01L 21/76802* (2013.01); *H01L 21/76877* (2013.01); *H01L 21/76897* (2013.01); *H01L 21/823418* (2013.01); *H01L 21/823475* (2013.01); *H01L 29/0847* (2013.01); *H01L 29/165* (2013.01); *H01L 29/167* (2013.01); *H01L 29/41791* (2013.01); *H01L 29/45* (2013.01); *H01L 29/66636* (2013.01); *H01L 29/66795* (2013.01); *H01L 21/02068* (2013.01); *H01L 21/02532* (2013.01); *H01L 21/31053* (2013.01); *H01L 21/31144* (2013.01); *H01L 21/823425* (2013.01); *H01L 21/823431* (2013.01); *H01L 29/161* (2013.01); *H01L 29/7848* (2013.01)

(58) Field of Classification Search
CPC . H01L 29/167; H01L 29/665; H01L 29/0847; H01L 29/41791; H01L 29/7848; H01L 29/7845; H01L 29/66636; H01L 29/66795; H01L 29/66507; H01L 21/02; H01L 21/265; H01L 21/285; H01L 21/311; H01L 21/324; H01L 21/768; H01L 21/8234; H01L 29/36513; H01L 29/28518; H01L 29/31111; H01L 29/76802; H01L 29/76877; H01L 29/76897; H01L 29/823425; H01L 29/823431; H01L 29/823418; H01L 29/823475; H01L 29/31053; H01L 29/31144; H01L 29/02532; H01L 29/02068
USPC .................................................. 257/197, 329
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,614,086 B1 | 4/2017 | Yeo et al. |
| 9,633,999 B1 | 4/2017 | Lu et al. |
| 9,812,453 B1 | 11/2017 | Mulfinger et al. |
| 10,164,048 B1 | 12/2018 | More et al. |
| 11,769,817 B2 * | 9/2023 | More ................ H01L 21/76877 438/285 |
| 2007/0099404 A1 | 5/2007 | Govindaraju et al. |
| 2007/0221956 A1 | 9/2007 | Inaba |
| 2009/0272976 A1 | 11/2009 | Brunco et al. |
| 2014/0065799 A1 | 3/2014 | Ahmed |
| 2015/0102411 A1 | 4/2015 | Ching et al. |
| 2016/0049335 A1 | 2/2016 | Liu et al. |
| 2016/0240673 A1 | 8/2016 | Chen et al. |
| 2016/0315008 A1 | 10/2016 | Tung et al. |
| 2017/0018464 A1 | 1/2017 | Kim |
| 2017/0053804 A1 | 2/2017 | Lu et al. |
| 2017/0186748 A1 | 6/2017 | Lee et al. |
| 2017/0213889 A1 | 7/2017 | Gluschenkov et al. |
| 2018/0342516 A1 | 11/2018 | Chiang et al. |
| 2019/0157269 A1 | 5/2019 | Koh et al. |

OTHER PUBLICATIONS

Koh, Shao-Ming et al., "Method for Forming Source/Drain Contacts", U.S. Appl. No. 15/867,058, filed Jan. 10, 2018, 59 pages.

Everaert, J-L., "Sub-10-9-9 Ω.cm2 Contact Resistivity on p-SiGe Achieved by Ga Doping and Nanosecond Laser Activation", 2017 Symposium on VLSI Technology Digest of Technical Papers, Jun. 5, 2017, Kyoto, Japan, pp. T214-T215.

\* cited by examiner

METHOD FOR FORMING SOURCE/DRAIN CONTACTS

BACKGROUND

This is a continuation application of U.S. patent application Ser. No. 16/871,882, filed May 11, 2020, which is a divisional application of U.S. patent application Ser. No. 16/211,451, filed Dec. 6, 2018, which is a continuation application of U.S. patent application Ser. No. 15/904,502, filed Feb. 26, 2018, which claims the benefit of U.S. Provisional Application No. 62/592,032, filed Nov. 29, 2017, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when the scaling down continues beyond 32 nm or smaller, source/drain (S/D) contact resistance becomes more and more dominant in overall transistor resistance. Methods and structures for reducing S/D contact resistance are highly desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
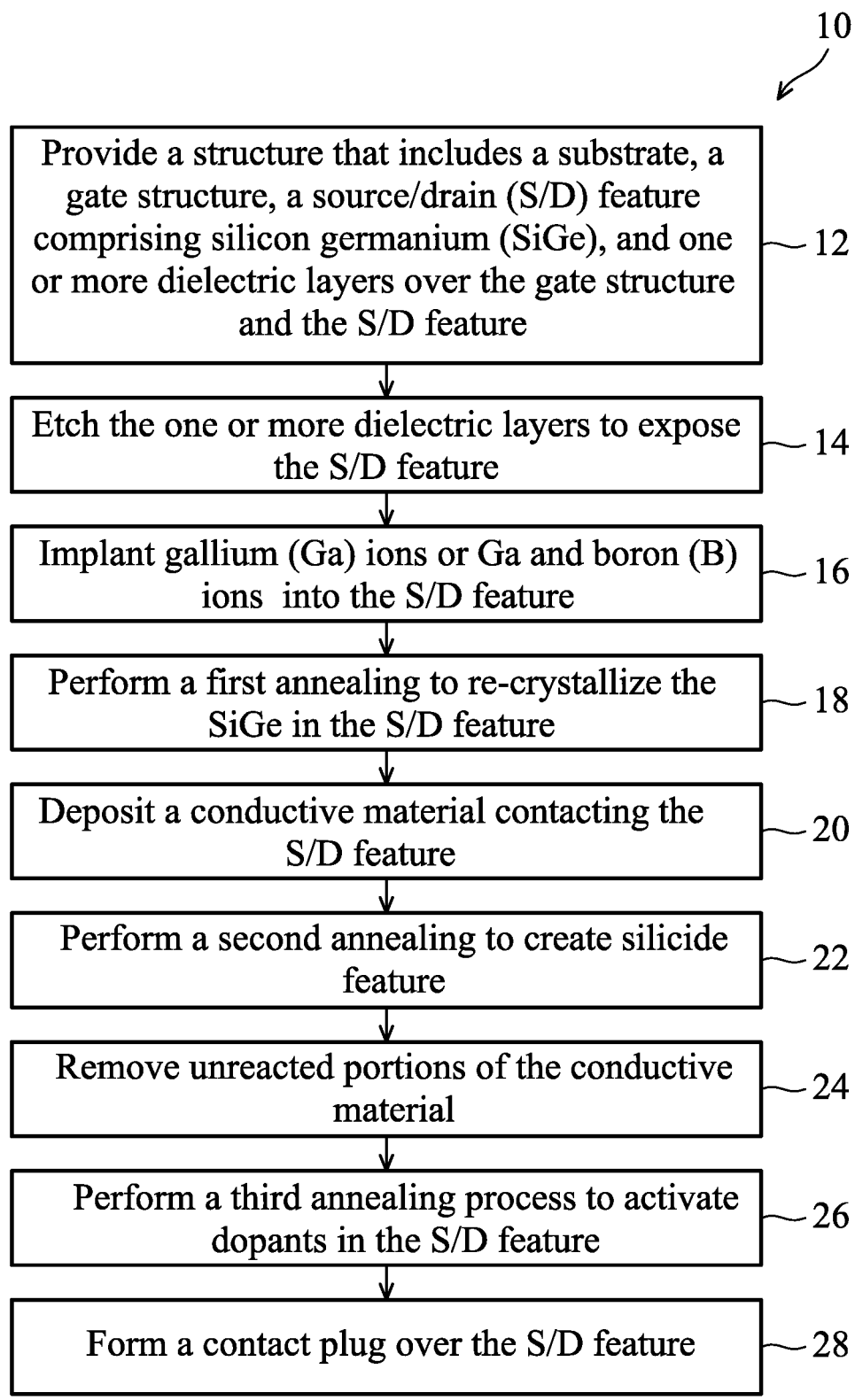
FIG. 1A shows a flow chart of a method of forming a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/− 10% of the number described or other values as understood by person skilled in the art. For example, the term "about 5 nm" encompasses the dimension range from 4.5 nm to 5.5 nm.

The present disclosure is generally related to semiconductor devices and methods of forming the same. More particularly, the present disclosure is related to forming source/drain (S/D) contacts for p-type transistors, particularly for p-type FinFETs. One object of the present disclosure is to reduce S/D contact resistance by implanting gallium (Ga) into S/D features having silicon germanium (SiGe) followed by appropriate annealing processes including annealing at a SiGe recrystallization (or repair) temperature. Embodiments of the present disclosure select certain ratio between Si and Ge in the S/D features to improve the Ga atoms' solubility therein, and select certain annealing temperatures and duration to allow both (a) SiGe alloy to repair after Ga ion implantation, and (b) Ga ions or atoms to segregate at the top of the S/D features. Both (a) and (b) help reduce S/D contact resistance. For example, the segregated Ga ions or atoms at the top of the S/D features reduce the formation of stable compounds having metal, silicon, and boron, thereby reducing the resistance between S/D contact plugs and the Ga-implanted SiGe S/D features. For example, recrystallization increases the conductivity in the SiGe alloy. These and other aspects of the present disclosure will be further discussed with reference to FIGS. 1A-11B.

Figure 1B:
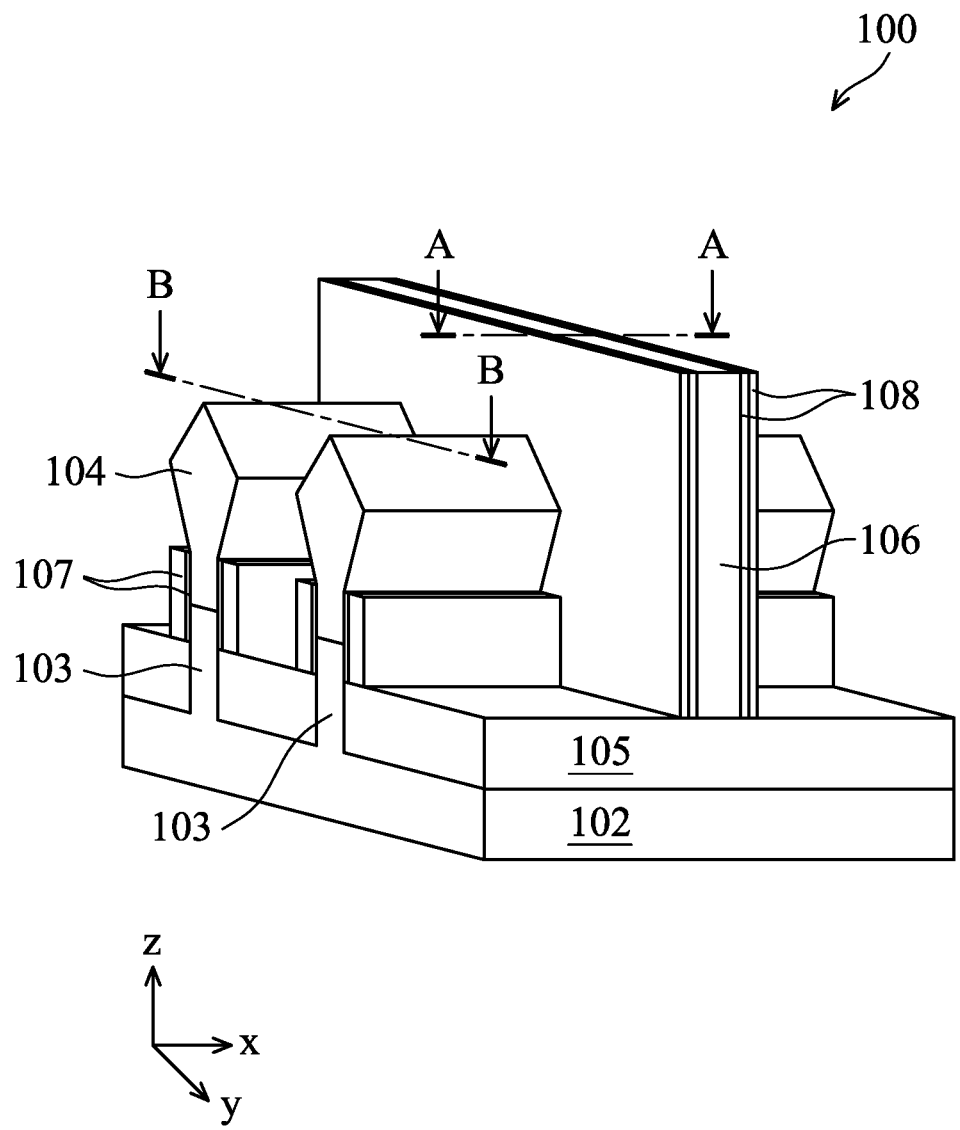
FIG. 1B shows a perspective view of a semiconductor device, in portion, in a manufacturing stage according to the method in FIG. 1A in accordance with embodiments of the present disclosure.

FIG. 1A shows a flow chart of a method 10 of forming a semiconductor device 100, according to various aspects of the present disclosure. A perspective view of the semiconductor device 100 at a fabrication stage is illustrated in FIG. 1B. The method 10 is merely an example, and is not intended to limit the present disclosure beyond what is explicitly recited in the claims. Additional operations can be provided before, during, and after the method 10, and some operations described can be replaced, eliminated, or relocated for additional embodiments of the method. Method 10 is described below in conjunction with FIGS. 2A-11B which are cross-sectional views of the semiconductor device 100 in various stages of a manufacturing process. Particularly, FIGS. 2A, 3A, 4A, 5A, 6A, 7A, 8A, 9A, 10A, and 11A are cross-sectional views of a portion of the device 100 along a fin length direction "A-A" of FIG. 1B; and FIGS. 2B, 3B, 4B, 5B, 6B, 7B, 8B, 9B, 10B, and 11B are cross-sectional views of the portion of the device 100 along a fin width direction "B-B" of FIG. 1B. The semiconductor device 100 is provided for illustration purposes and does not necessarily limit the embodiments of the present disclosure to any number of devices, any number of regions, or any configuration of structures or regions. Furthermore, the semiconductor device 100 as shown in FIGS. 2A-11B may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
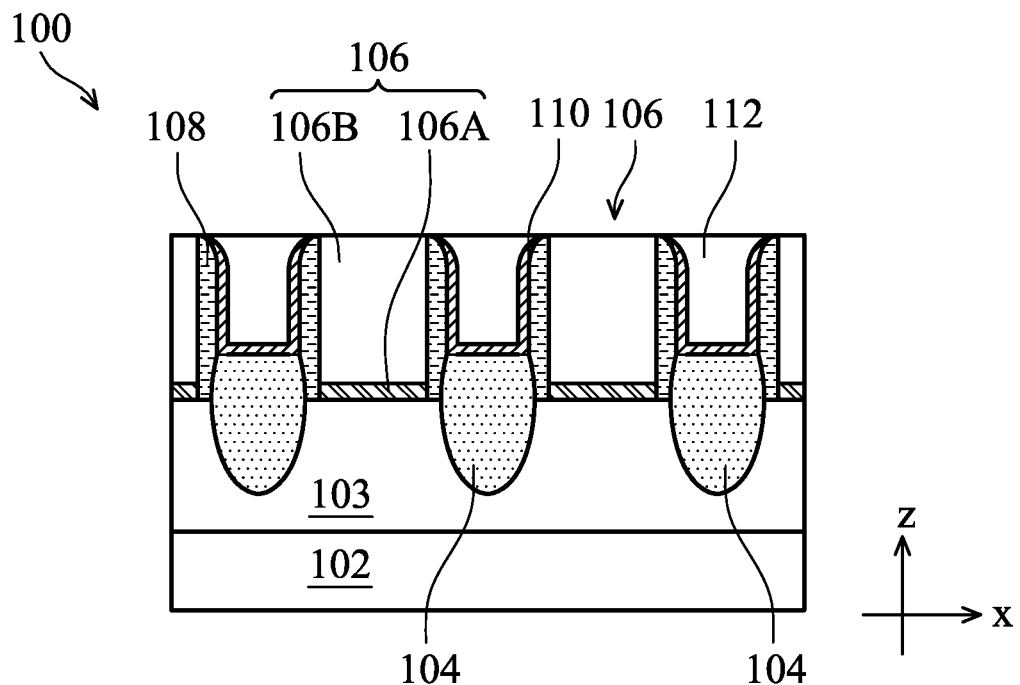
FIGS. 2A, 3A, 4A, 5A, 6A, 7A, 8A, 9A, 10A, and 11A are cross-sectional views (along a fin length direction) of a portion of a semiconductor device during various manufacturing stages according to the method in FIG. 1A in accordance with embodiments of the present disclosure.
Figure 2B:
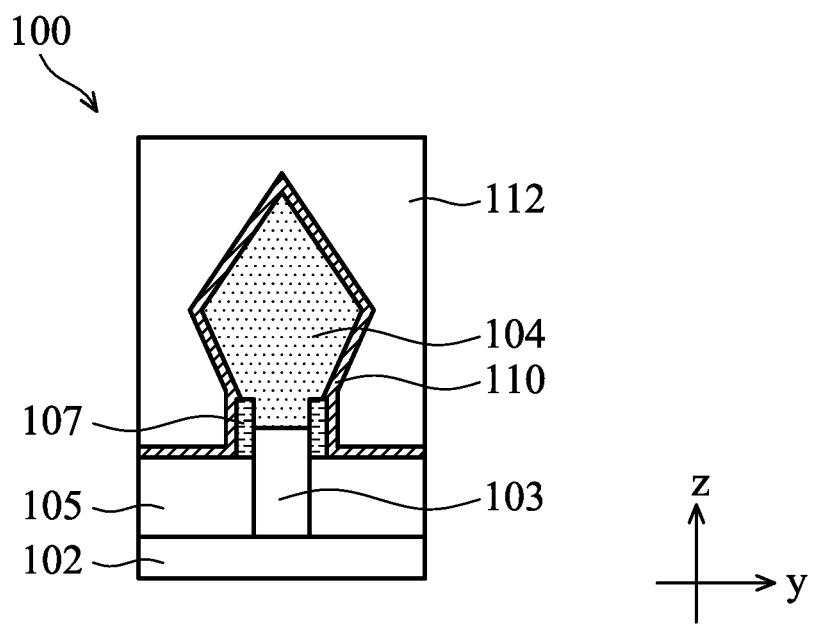
FIGS. 2B, 3B, 4B, 5B, 6B, 7B, 8B, 9B, 10B, and 11B are cross-sectional views (along a fin width direction) of a portion of a semiconductor device during various manufacturing stages according to the method in FIG. 1A in accordance with embodiments of the present disclosure.

At operation 12, the method 10 (FIG. 1A) provides a structure of the device 100 as shown in FIGS. 2A and 2B, with FIG. 1B showing the perspective view of some of the components of the device 100. Referring to FIGS. 1B, 2A, and 2B collectively, the device 100 includes a substrate 102 and various features formed therein or thereon. The device 100 further includes one or more semiconductor fins 103 (one shown) separated by an isolation structure 105. Particularly, FIG. 2A illustrates the device 100 in a cross-sectional view along the length of the fin 103 (the "x" direction), and FIG. 2B illustrates the device 100 in a cross-sectional view along the width of the fin 103 (the "y" direction) in an S/D region of the device 100. The device 100 further includes gate stacks (or gate structures) 106 adjacent to channel regions of the fin 103 and S/D features 104 over the fin 103 and on both sides of the gate stacks 106. The device 100 further includes gate spacers 108 on sidewalls of the gate stacks 106, fin sidewall spacers 107 on sidewalls of the fins 103, a contact etch stop layer (CESL) 110 over the gate spacers 108 and the S/D features 104, and a dielectric layer 112 over the CESL 110 and filling in the gaps between adjacent gate spacers 108. The various features (or components) of the device 100 are further described below.

The substrate 102 is a silicon (Si) substrate in the present embodiment. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 103 may include one or more layers of semiconductor materials such as silicon or silicon germanium. In an embodiment, the fins 103 include multiple layers of semiconductor materials alternately stacked one over the other, for example, having multiple layers of silicon and multiple layers of silicon germanium alternately stacked. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable.

The S/D features 104 may include epitaxial semiconductor materials, for example, for applying proper stress and enhancing performance of the device 100. In the present embodiment, the S/D features 104 include epitaxially grown silicon germanium (SiGe) alloy, which may be doped with one or more p-type dopants such as boron (B) or indium (In). In an embodiment, the ratio between Ge and Si in the SiGe alloy is greater than 1 (i.e., Ge:Si>1). In a further embodiment, an atomic concentration of Ge in the SiGe alloy is greater than 50% but less than 90%, such as in a range from about 55% to about 75%. In other words, the S/D features 104 include $Si_{1-x}Ge_x$ alloy where x represents Ge composition in atomic percent and x is greater than 50% and less 90%, such as in a range from about 55% to about 75%. In various embodiments, the specific range of Ge concentration in the S/D features 104 is selected to fulfill multiple purposes. One purpose is to improve gallium's solubility in the SiGe alloy during a subsequent gallium ion implantation process. It has been found that the higher the Ge:Si ratio in the SiGe alloy, the easier for gallium ions or atoms to dissolve in the SiGe alloy, hence the less defects in the SiGe alloy after it has been implanted with gallium ions. However, the Ge:Si ratio in the SiGe alloy also affects the activation of the p-type dopants (e.g., boron) therein. It has been found that the higher the Ge:Si ratio, the lower the activation rates of the p-type dopants. In the present embodiment, the selection of the Ge:Si ratio (as discussed above) favors the gallium dissolvability in order to reduce the S/D contact resistance while ensuring sufficient activation rates of the p-type dopants for device performance. Still further, the selection of the Ge:Si ratio in the SiGe alloy works in conjunction with subsequent annealing processes (e.g., operation 18) to foster SiGe recrystallization and to reduce defects therein.

In one implementation, the S/D features 104 are formed by etching recesses into the fins 103 and epitaxially growing SiGe alloy doped with one or more p-type dopants such as boron and/or indium. The doping may be performed during the epitaxial growth (in-situ) or after the epitaxial growth (ex-situ). Further, each of the S/D features 104 may include one or more layers (e.g., three layers) of SiGe alloy with different dopant concentrations. Adjacent S/D features 104 may be separated from each other or may merge together in some embodiments. Each of the S/D features 104 may be of any suitable shape such as a multi-facet shape.

The isolation structure 105 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers on surfaces of the substrate 102 and the fins 103 and a main isolating layer over the one or more liner layers.

Each of the gate stacks 106 includes a multi-layer structure. For example, each of the gate stacks 106 may include a dielectric interfacial layer (not shown), a gate dielectric layer 106A (e.g., $SiO_2$) over the dielectric interfacial layer, and a gate electrode layer 106B over the gate dielectric layer 106A. In an embodiment, each of the gate stacks 106 includes a so-called "high-k metal gate" that may include a high-k gate dielectric layer 106A, a work function layer (a part of the gate electrode layer 106B) over the high-k gate dielectric layer, and a metal layer (another part of the gate electrode layer 106B) over the work function layer. The gate stacks 106 may include additional layers such as capping layers and barrier layers. In various embodiments, the dielectric interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The high-k gate dielectric layer may include hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof; and may be formed by ALD and/or other suitable methods. The work function layer may include a metal selected from but not restricted to the group of titanium aluminum nitride (TiAlN), titanium nitride (TiN), tantalum nitride (TaN), ruthenium (Ru), molybdenum (Mo), tungsten (W), platinum (Pt), aluminum (Al), or combinations thereof; and may be deposited by CVD, PVD, and/or other suitable process. The gate electrode layer may include polysilicon or a metal such as aluminum (Al), tungsten (W), cobalt (Co), copper (Cu), and/or other suitable materials; and may be deposited using plating, CVD, PVD, or other suitable processes. The gate stacks 106 may be formed by any suitable processes including gate-first processes and gate-last processes. In a gate-first process, various material layers are deposited and patterned to become the gate stacks 106 before the S/D features 104 are formed. In a gate-last process (also termed as a gate replacement process), temporary gate structures are formed first. Then, after the S/D features 104 are formed, the temporary gate structures are removed and replaced with the gate stacks 106.

Each of the fin sidewall spacers 107 and the gate spacers 108 may be a single layer or multi-layer structure. In some embodiments, each of the spacers 107 and 108 include a dielectric material, such as silicon oxide ($SiO_2$), silicon nitride ($Si_3N_4$), silicon oxynitride (SiON), other dielectric material, or combination thereof. In an example, the spacers 107 and 108 are formed by depositing a first dielectric layer (e.g., a $SiO_2$ layer having a substantially uniform thickness) as an liner layer over the device 100 including the gate stacks 106 and the fins 103, and a second dielectric layer (e.g., a $Si_3N_4$ layer) as a main D-shaped spacer over the first dielectric layer, and then, anisotropically etching to remove portions of the dielectric layers to form the spacers 107 and 108. Additionally, the fin sidewall spacers 107 may be partially removed during the etching process that forms recesses into the fins 103 prior to growing the S/D features 104. In some embodiments, the fin sidewall spacers 107 may be completely removed by such etching process.

The CESL 110 may include silicon nitride ($Si_3N_4$), silicon oxynitride (SiON), silicon nitride with oxygen (O) or carbon (C) elements, and/or other materials. In one example, the CESL 110 includes silicon nitride ($Si_3N_4$) having an intrinsic stress with a magnitude of 1 GPa or higher. The intrinsic stress is compressive for p-channel devices and tensile for n-channel devices. The CESL 110 may be formed by plasma enhanced CVD (PECVD) process and/or other suitable deposition or oxidation processes. The CESL 110 covers the outer surfaces of the S/D features 104, the sidewalls of the gate spacers 108, and the top surface of the isolation structure 105.

The dielectric layer (or interlayer dielectric or ILD) 112 may include materials such as tetraethylorthosilicate (TEOS) oxide, un-doped silicate glass, or doped silicon oxide such as borophosphosilicate glass (BPSG), fluoride-doped silicate glass (FSG), phosphosilicate glass (PSG), boron doped silicon glass (BSG), and/or other suitable dielectric materials. The dielectric layer 112 may be deposited by a PECVD process, a flowable CVD (FCVD) process, or other suitable deposition technique. In an embodiment, the CESL 110 is deposited as a conformal layer over the substrate 102 covering various structures thereon, and the dielectric layer 112 is deposited over the CESL 110 to fill trenches between the gate stacks 106.

At operation 14, the method 10 (FIG. 1A) etches the dielectric layer 112 and the CESL 110 to expose the S/D features 104, in preparation for forming S/D contacts over the respective S/D features 104. This may involve a variety of processes including deposition, photolithography, and etching.

Figure 3A:
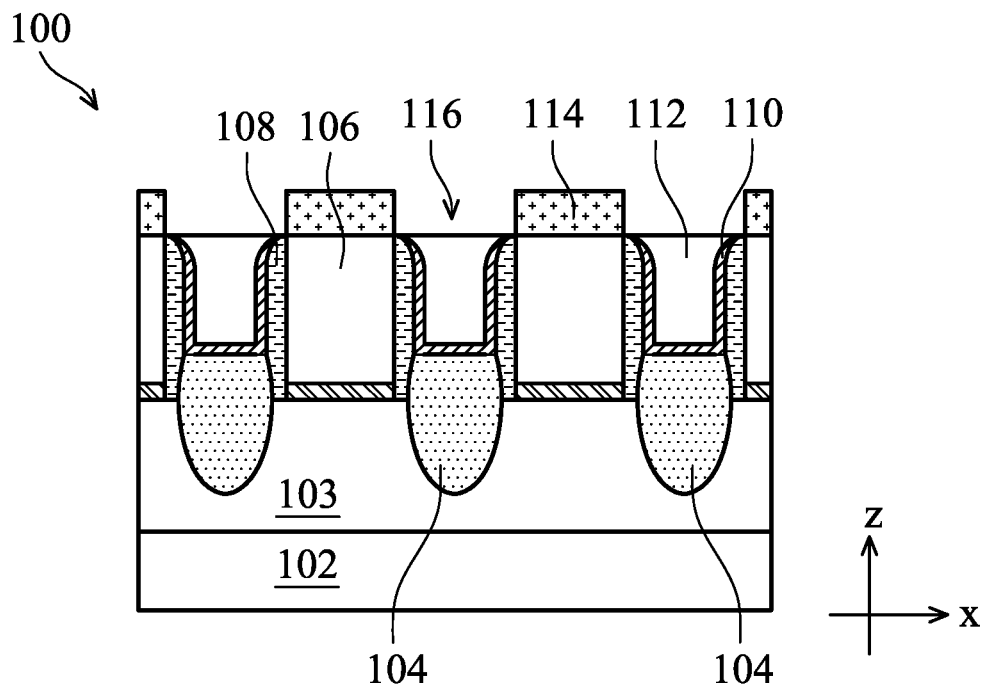
Figure 3B:
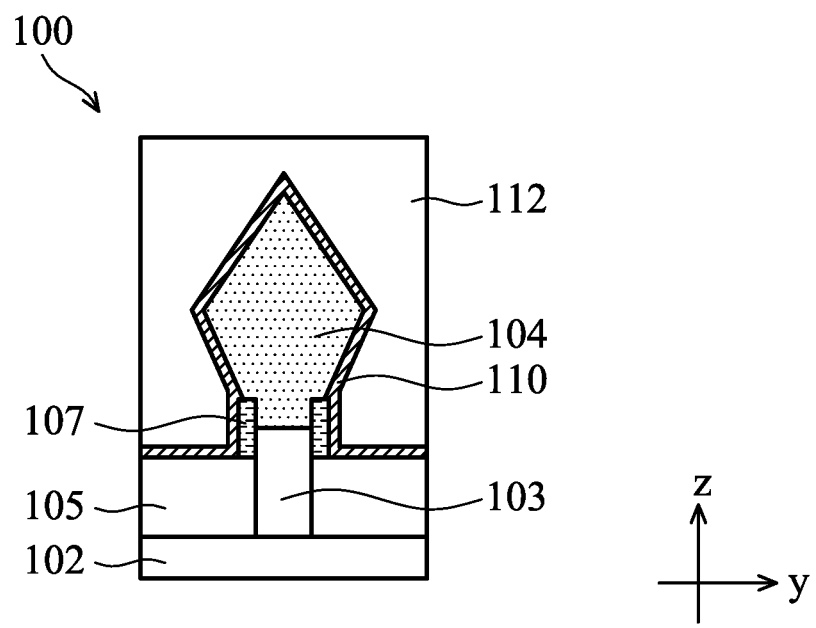

Referring to FIGS. 3A and 3B, an etch mask 114 is formed over the device 100, providing openings 116 exposing various portions of the device 100. The openings 116 correspond to the areas of the device 100 where S/D contacts for S/D features 104 are to be formed. In various embodiments, the etch mask 114 may include a hard mask layer (e.g., having silicon nitride or silicon oxide), a photoresist layer, or a combination thereof. The etch mask 114 may be formed by photolithography and etching processes.

Figure 4A:
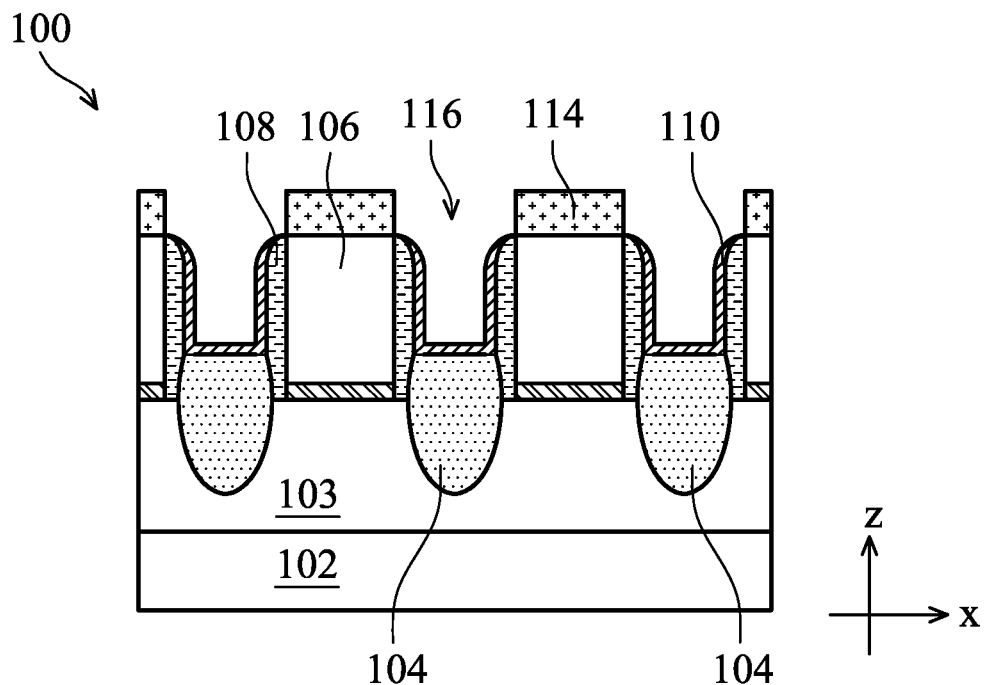
Figure 4B:
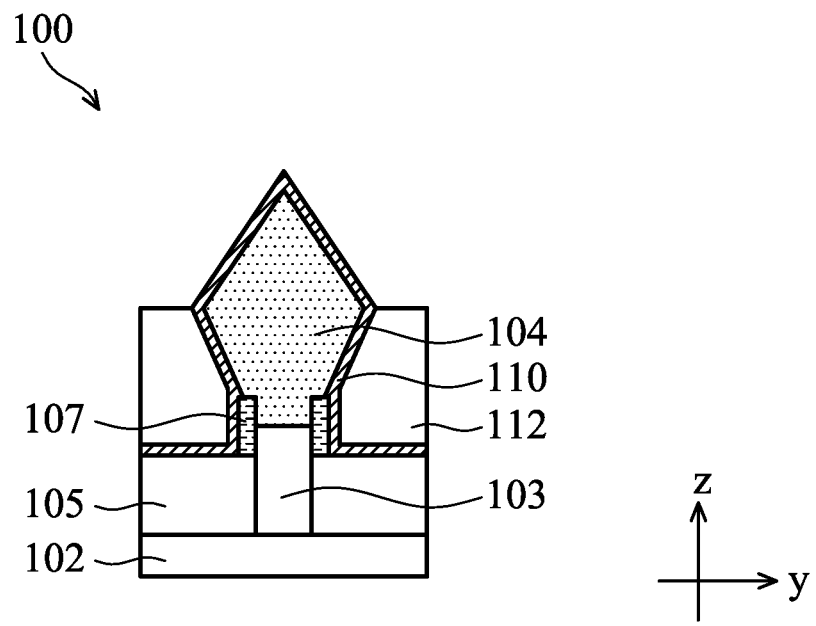

Referring to FIGS. 4A and 4B, the device 100 is etched through the openings 116 to remove the exposed portions of the dielectric layer 112, for example, using a dry etching process, a wet etching process, a reactive ion etching process, or other suitable etching processes. In the present embodiment, the etching process is tuned selective to the material of the dielectric layer 112, and does not (or insignificantly) etch the gate stacks 106, the gate spacers 108, and the CESL 110.

Figure 5A:
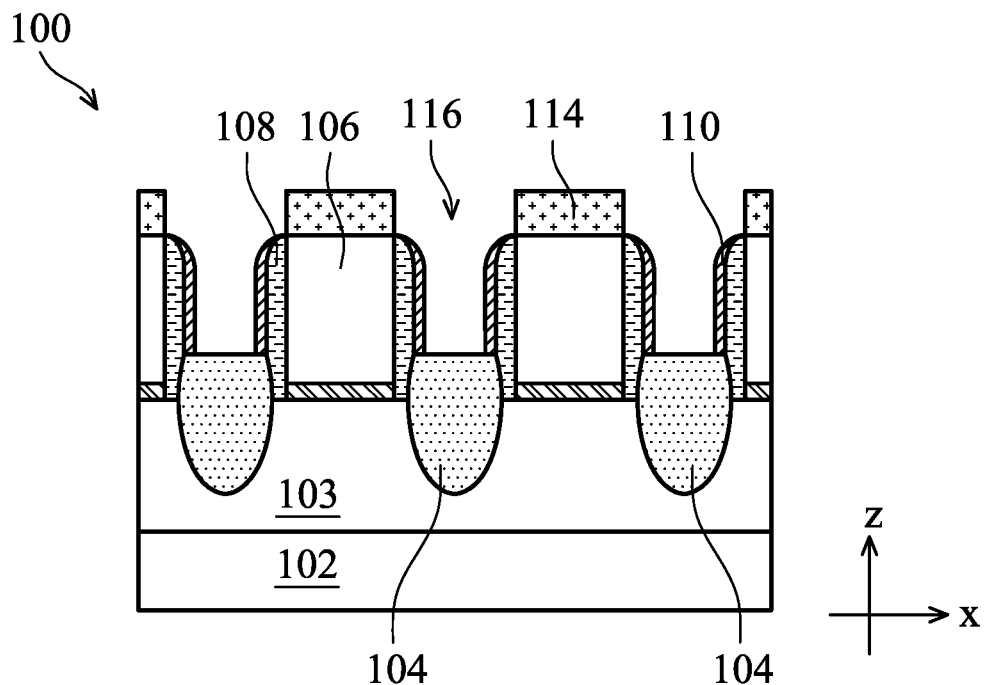
Figure 5B:
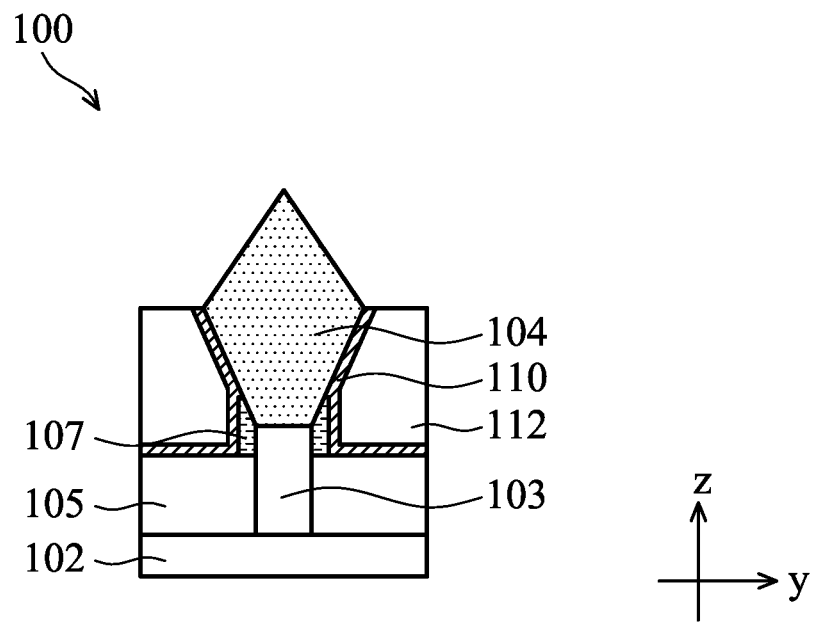

Referring to FIGS. 5A and 5B, the device 100 is etched through the openings 116 to remove portions of the CESL 110 at the bottom of the openings 116, for example, using a dry etching process, a wet etching process, or a reactive ion etching process. Particularly, this etching process is anisotropic and is tuned selective to the CESL 110. As a result, portions of the CESL 110 remain over the sidewalls of the gate stacks 106 after the etching process is finished. In various embodiments, the dielectric layer 112 and the CESL 110 may be etched by one joint etching process or more than one etching process.

Figure 6A:
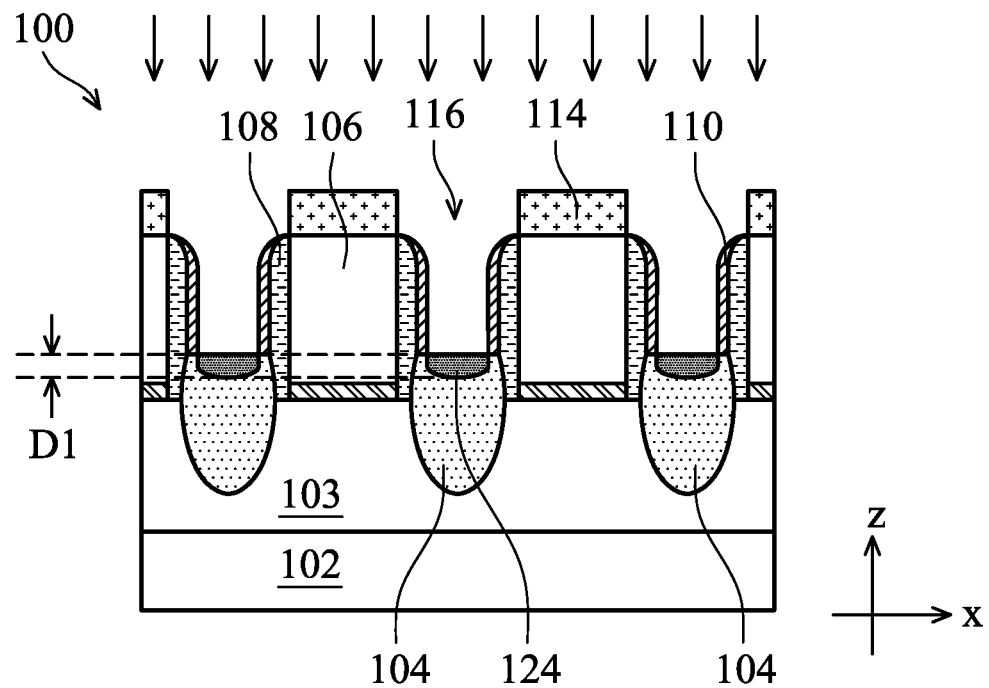
Figure 6B:
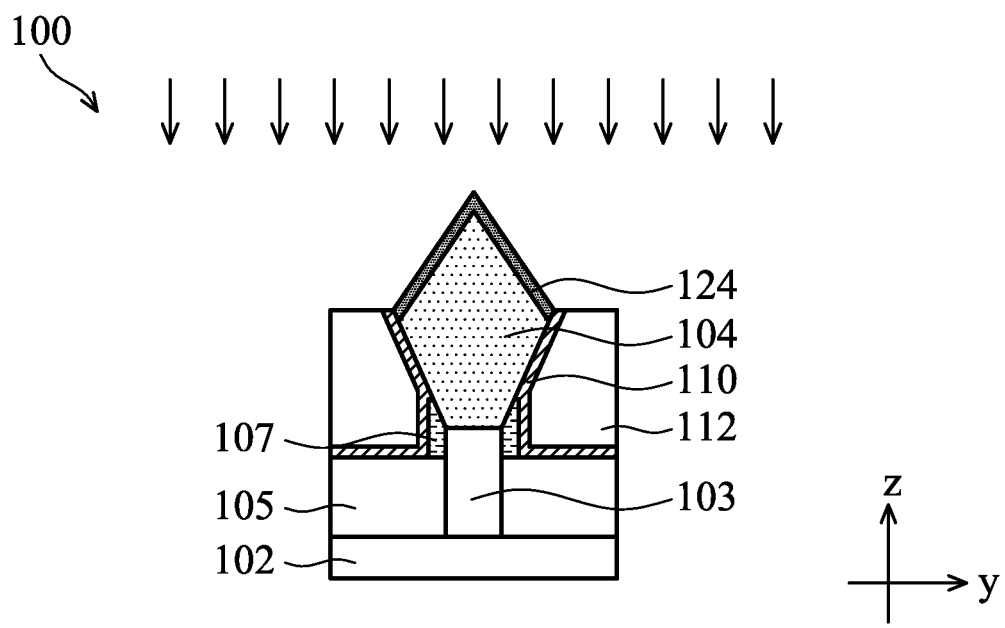

At operation 16, the method 10 (FIG. 1A) implants gallium (Ga) ions or Ga and boron (B) ions into the exposed S/D features 104. In an embodiment, the operation 16 implants only Ga ions into the exposed S/D features 104. However, certain B ions may be in-situ doped into the S/D features 104 when the S/D features 104 are epitaxially grown. Therefore, both Ga ions and B ions may still be co-existent in the S/D features 104 in such embodiment. In another embodiment, the operation 16 implants both Ga ions and B ions into the exposed S/D features 104. In this embodiment, implanting B ions increases the B contents in the S/D features 104. As shown in FIGS. 6A and 6B, the operation 16 produces a Ga-implanted layer 124 in a top portion of the S/D feature 104. In an embodiment, the device 100 includes both p-type devices and n-type devices. To further this embodiment, the method 10 forms a masking element (not shown) covering the n-type devices and exposing the p-type devices for the operation 16.

In some embodiments, the depth D1 of the Ga-implanted layer 124 along the Z direction is in a range from about 5 nm to about 15 nm. The Ga ions may be distributed evenly or unevenly (e.g., having a gradient distribution in its ion density) within the Ga-implanted layer 124. If the depth D1 is too large (e.g., exceeding 20 nm), the defects introduced by the Ga implantation might not be fully repaired by the annealing processes (e.g., operation 18) to be discussed. To further these embodiments, the Ga ion implantation at operation 16 may be performed with energy ranging from about 0.5 keV to about 10 keV. Typically, smaller implantation energy produces a smaller depth D1. In some implementations, the Ga ion implantation at operation 16 is performed with a Ga ion dose ranging from about $5E14$ ions/cm$^{-2}$ (or simply, cm$^{-2}$) to about $8E15$ cm$^{-2}$, such as from about $5E14$ cm$^{-2}$ to about $1E15$ cm$^{-2}$. The selected range of Ga ion dose is beneficial in various embodiments. If the ion dose is too low, the effects of Ga implantation (for reducing S/D contact resistance) may be negligible. If the ion dose is too high, the implanted Ga ions may not be completely dissolved into the SiGe alloy in the S/D features 104, increasing defects therein.

In embodiments where boron (B) ions are also implanted at the operation 16, B ion implantation can be performed together with the Ga ion implantation or be performed separately. For example, B ion implantation can be performed first at a doping energy between about 0.5 keV to about 10 keV with an ion dose ranging from about $1E15$ cm$^{-2}$ to about $1E16$ cm$^{-2}$ such as from about $1E15$ cm$^{-2}$ to about $2E15$ cm$^{-2}$, followed by the Ga ion implantation as discussed above. In some implementations, the order of the B ion implantation and the Ga ion implantation can be reversed, with Ga ion implantation performed first. In some other embodiments, the Ga ion implantation and the B ion implantation are performed simultaneously. For example, at the operation 16, the S/D features 104 can be implanted at a doping energy between about 0.5 keV and about 10 keV with boron ions at a dose between about $1E15$ cm$^{-2}$ and about $2E15$cm$^{-2}$ and gallium ions at a dose between about $5E14$ cm$^{31\ 2}$ and about $1E15$ cm$^{-2}$.

At operation 18, the method 10 (FIG. 1A) performs a first annealing process to the device 100. In the present embodiment, the first annealing process is designed to re-crystallize the SiGe alloy in the S/D features 104, which may have been amorphized (becoming more amorphous) during the operation 16. In the present disclosure, the term "SiGe recrystallization" and alike refer to the process where the SiGe alloy repairs itself (e.g., during a thermal process) to become less amorphous by removing vacancies, amorphous layers, and/or crystalline imperfections resulted from the gallium/boron ion implantation. The less amorphous the SiGe alloy, the better conductivity it may provide. In the present embodiment, the first annealing process is performed at a temperature in a range from about 400 degrees Celsius (° C.) to about 600° C., such as from about 525° C. to about 575° C., and for duration in a range from about 10 seconds to about 50 seconds, such as from about 20 seconds to about 40 seconds. In a specific example, the first annealing process may be performed at about 550° C. for about 30 seconds. In various embodiments, the annealing duration may be shorter when the annealing temperature is higher, and the annealing duration may be longer when the annealing temperature is lower. The annealing temperature and duration are chosen to benefit various aspects of the present disclosure, as discussed below.

Figure 7A:
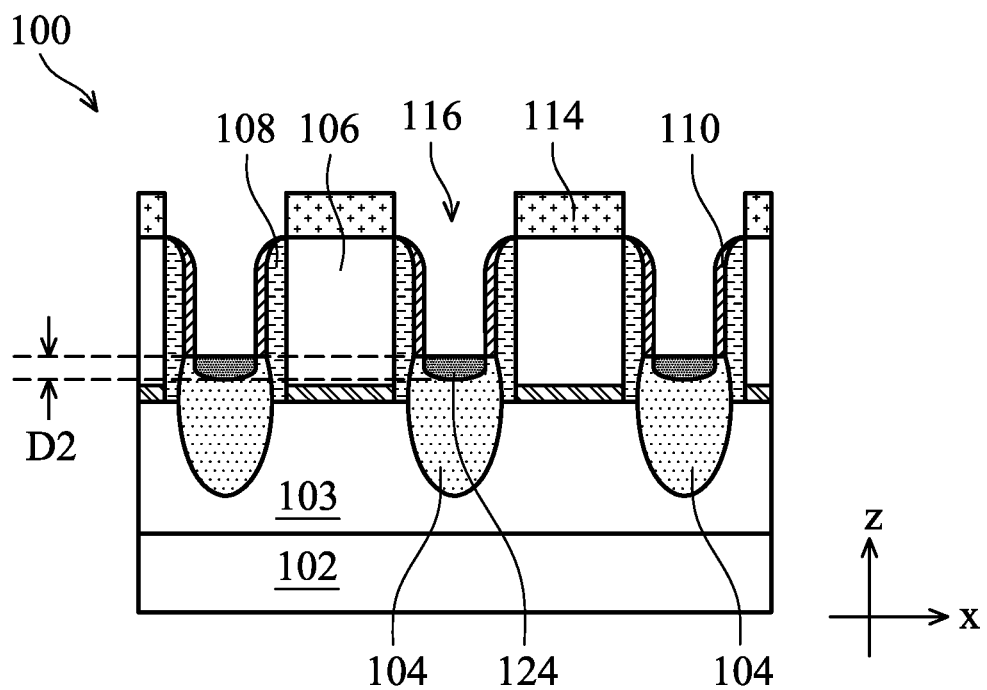
Figure 7B:
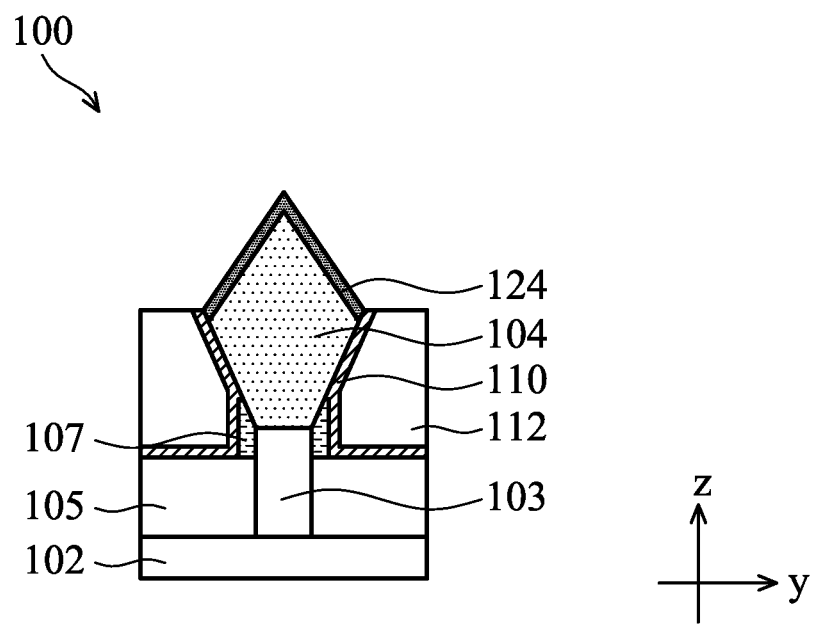

One aspect is related to the integrity of the gate stacks 106. Since the gate stacks 106 may include one or more metals in the present embodiment, the first annealing process is performed at a sufficiently low temperature so as not to damage the gate stacks 106. For example, the first annealing process is performed at a temperature below the melting point of the metal materials in the gate stacks 106. Another aspect is related to the SiGe recrystallization in the S/D features 104. If the annealing temperature is too low, the SiGe alloy may not be able to repair the defects introduced by the Ga ion implantation, or the annealing process may take too long to be economically practical for the semiconductor manufacturing. Therefore, the temperature for the first annealing process is controlled to be in the ranges discussed above. The first annealing process also serves another purpose—it causes Ga atoms or ions to segregate and move to a top portion of the S/D features 104. Ga and silicon generally form eutectic bonds. These bonds are easily broken at the temperature of the first annealing process. Once the bonds are broken, the Ga atoms or ions tend to move to a top portion of the S/D features 104. As a result, the Ga-implanted layer 124 becomes thinner after the operation 18. FIGS. 7A and 7B illustrate the semiconductor device 100 after the first annealing process. The depth D2 within the S/D features 104 where Ga is distributed is smaller than D1, for example by 40% to 60%. For example, in an embodiment where D1 is about 15 nm, D2 may range from about 6 nm to about 8 nm. As will be discussed later, the segregated Ga atoms or ions help reduce S/D contact resistance.

The operation 18 may also clean surfaces of the S/D features 104 to prepare them for a subsequent silicidation process. For example, the operation 18 may use a dry cleaning process or a wet cleaning process. For example, a dry cleaning process may use SiConi etch, which is a remote plasma assisted dry etch process involving the simultaneous exposure of an object to Hz, NF$_3$, and NH$_3$ plasma byproducts. For example, a wet cleaning process may involve the use of diluted hydrofluoric acid (DHF) solution to clean the surfaces of the S/D features 104.

Figure 8A:
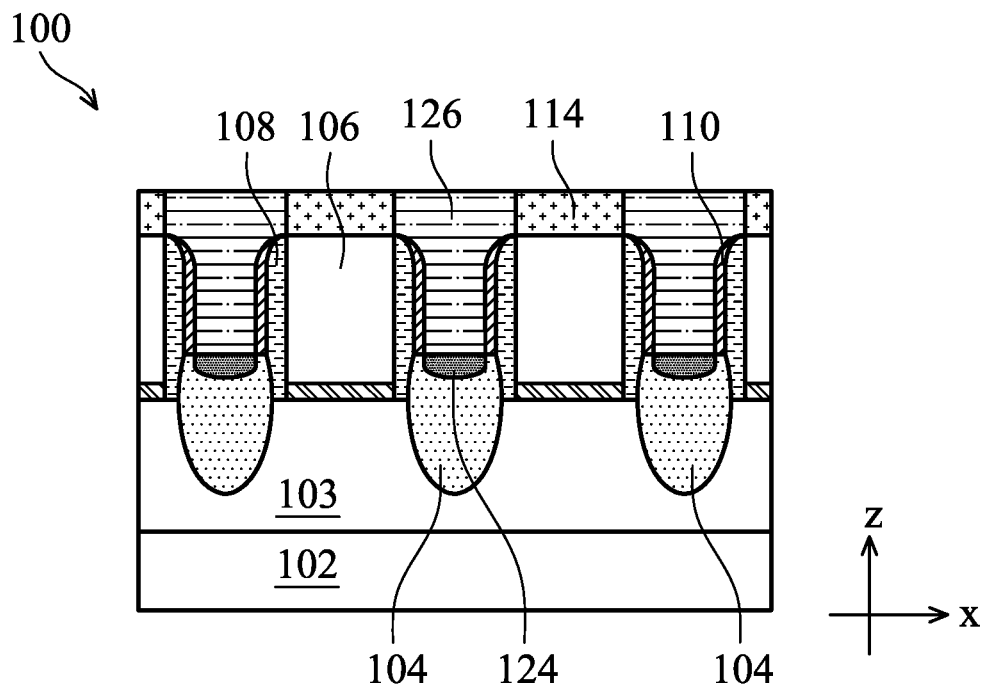
Figure 8B:
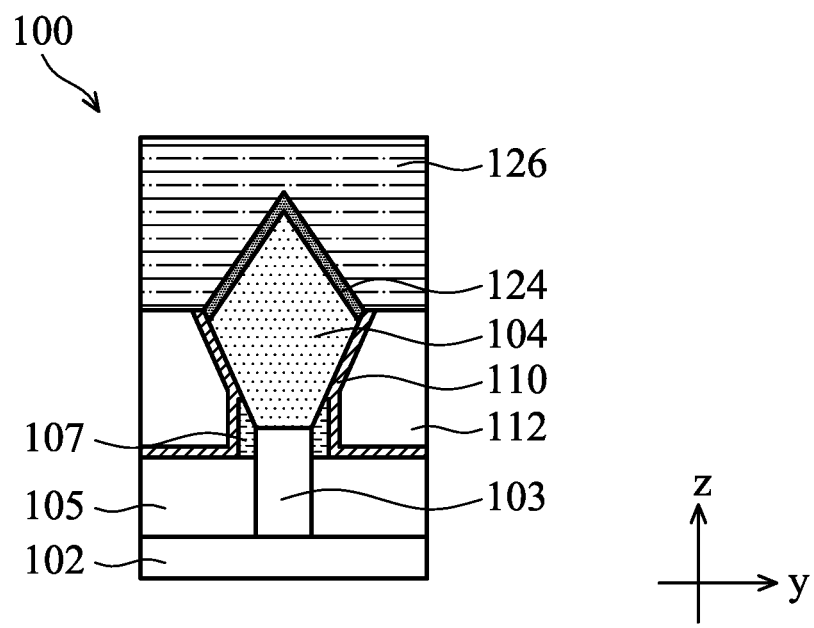

At operation 20, the method 10 (FIG. 1A) deposits a layer 126 into the opening 116, as part of a silicidation process. Referring to FIGS. 8A and 8B, the layer 126 is deposited to be in physical contact with the S/D feature 104 including SiGe alloy and Ga atoms. In an embodiment, the layer 126 includes a conductive material having one or more metals. For example, the layer 126 may include titanium (Ti). Additionally or alternatively, the layer 126 may include tantalum (Ta), nickel (Ni), platinum (Pt), ytterbium (Yb), iridium (Ir), erbium (Er), cobalt (Co), or a combination thereof (e.g., an alloy of two or more metals). The layer 126 may be deposited using CVD, PVD, ALD, or other suitable methods. In an embodiment, the etch mask 114 may be removed before the deposition of the layer 126.

Figure 9A:
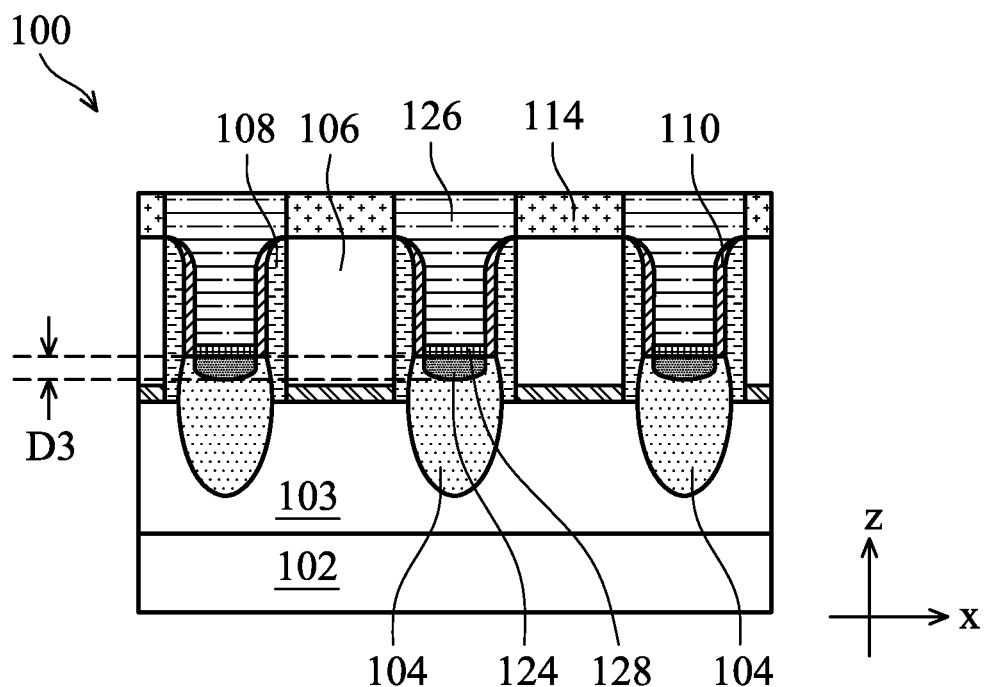
Figure 9B:
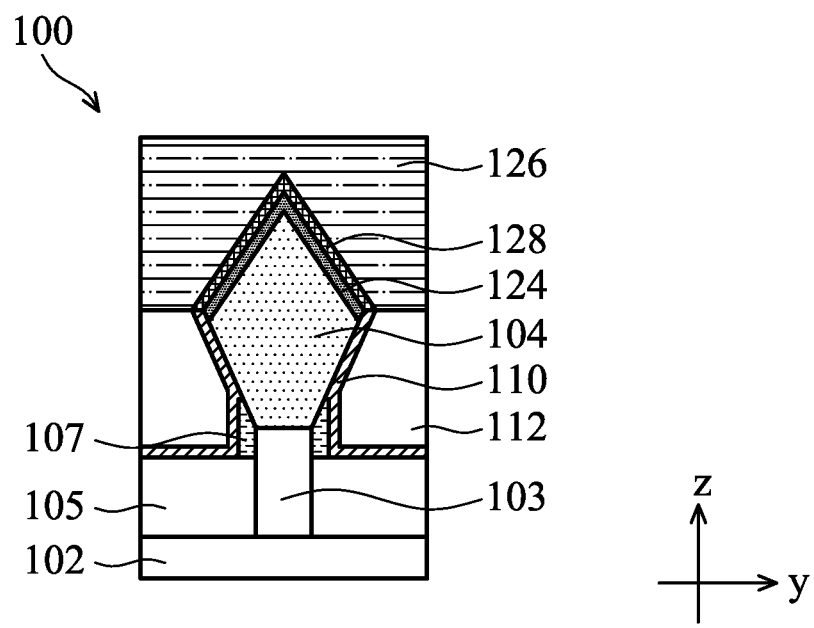

At operation 22, the method 10 (FIG. 1A) performs a second annealing process to the device 100 to cause reaction between the layer 126 and the S/D feature 104, thereby producing a silicide feature 128 (FIGS. 9A and 9B). In an embodiment, the second annealing process is performed at a temperature in a range from about 400° C. to about 600° C., such as from about 525° C. to about 575° C., and for duration in a range from about 5 seconds to about 30 seconds, such as from about 10 seconds to about 20 seconds. In a specific example, the second annealing process may be performed at about 550° C. for about 15 seconds. In various embodiments, the second annealing duration may be shorter when the second annealing temperature is higher, and the second annealing duration may be longer when the second annealing temperature is lower. The temperature of the second annealing process is chosen to maintain the integrity of the gate stacks 106 as discussed above with respect to the operation 18, yet high enough to cause reaction between the metallic materials in the layer 126 and the semiconductor materials in the S/D feature 104. In an embodiment, the second annealing process causes the Ga ions to further segregate and to move up in the S/D features 104. As a result, the depth of the Ga-implanted layer 124 may become even thinner. In other words, the depth D3 (FIG. 9A) is smaller than the depth D2 (FIG. 7A) in this embodiment.

In the present embodiment, the silicide feature 128 includes one or more compounds having Si and one or more metals from the layer 126, and may further include Ge and/or Ga. For example, the silicide feature 128 may include titanium silicide (TiSi), nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. Depending on the type of the metals in the layer 126, the silicide feature 128 may or may not include a stable compound of the metal(s) and Ga. For example, when the layer 126 includes Ti, the feature 128 may include a stable compound of Ti-Si, and Ga atoms may be segregated at an interface between the S/D feature 104 (including the Ga-implanted layer 124) and the silicide feature 128. This provides benefits to the present disclosure because the segregated Ga atoms help reduce resistance by blocking boron atoms from reacting with the silicide feature 128. The boron atoms may be introduced into the S/D feature 104 during the epitaxial growth of the S/D feature 104 or during the Ga and B ion implantation (the operation 16). Without the segregated Ga atoms, the boron atoms would react with Ti or TiSi to form stable compounds $Ti-B_2$ or Ti-Si-B, which have a relatively high sheet resistance.

Figure 10A:
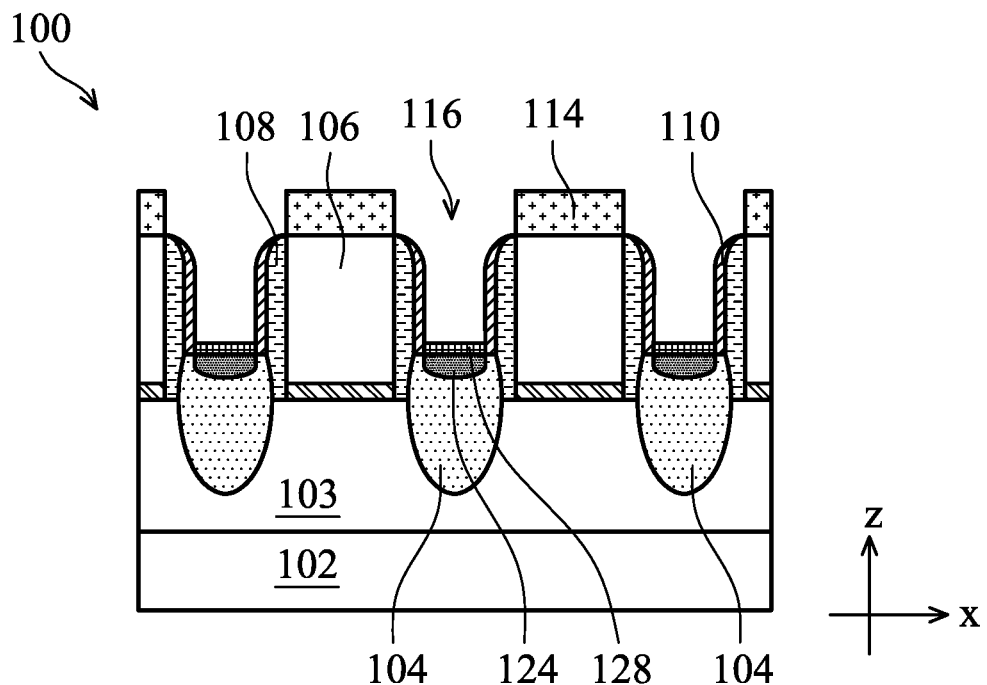
Figure 10B:
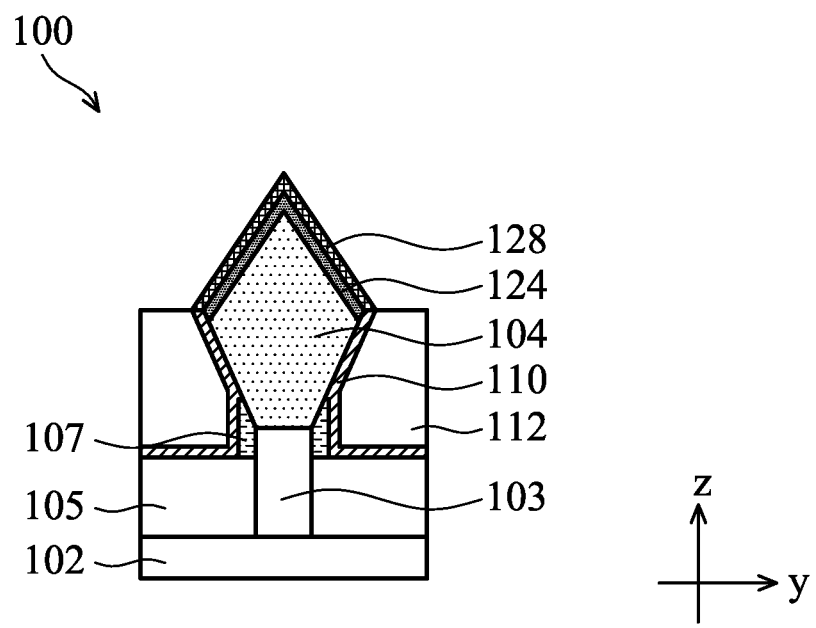

At operation 24, the method 10 (FIG. 1A) remove unreacted portions of the layer 126, leaving the silicide feature 128 exposed in the opening 116 (FIGS. 10A and 10B). The operation 24 may include a wet etching process, a dry etching process, a reactive ion etching process, or other suitable etching processes. The etching processes in operation 24 are selective to the materials in the layer 126.

At operation 26, the method 10 (FIG. 1A) performs a third annealing process to activate dopants (e.g., Ga or Ga and B) in the S/D features 104. In the present embodiment, the third annealing process is performed at a temperature higher than that of the first (operation 18) and the second (operation 22) annealing processes. In a further embodiment, the temperature of the third annealing process is designed to maintain the integrity of the gate stacks 106. For example, it is performed at a temperature below a melting point of the metals in the gate stacks 106. In an embodiment, the third annealing process is performed at a temperature in a range from about 700° C. to about 950° C., such as from about 800° C. to about 900° C., for duration ranging from about 10 seconds to about 20 seconds, and using mostly spike annealing. The operation 26 may use one or more annealing processes such as microwave annealing (MWA) process, microsecond annealing (RSSA) process, rapid thermal annealing (RTA) process, dynamic spike annealing (DSA) process, melting laser annealing (MLA) process, and/or other suitable annealing processes.

Figure 11A:
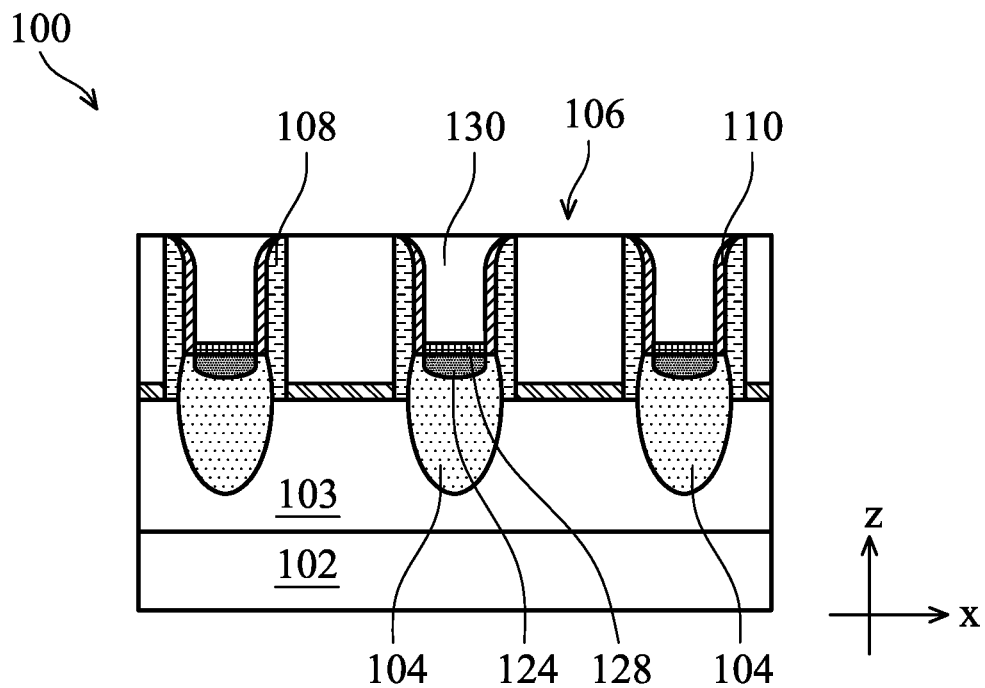
Figure 11B:
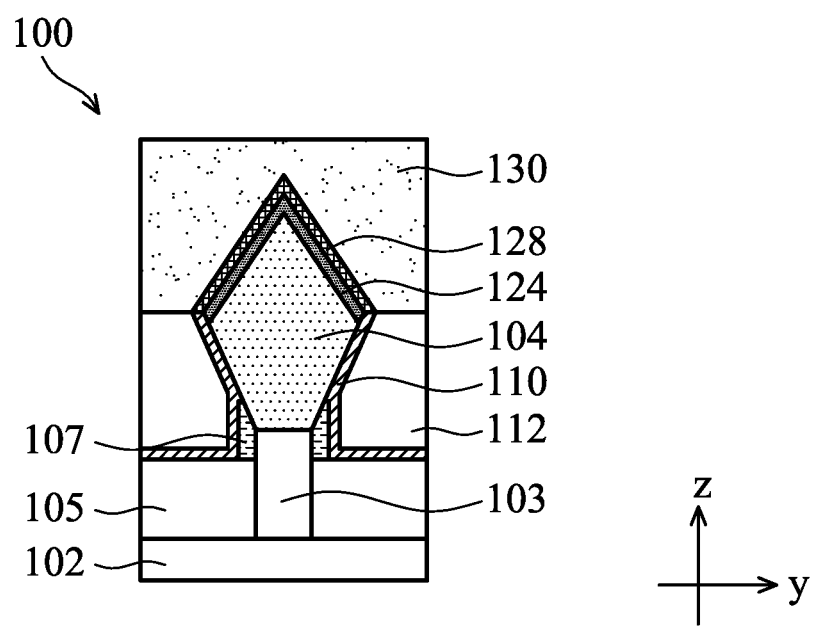

At operation 28, the method 10 (FIG. 1A) forms an S/D contact plug (or simply, S/D contact) 130 over the silicide feature 128 by depositing one or more metals or metallic compounds (e.g., TiN) in the opening 116. Referring to FIGS. 11A and 11B, the S/D contact 130 is deposited over the top and side surfaces of the S/D features 104 in the present embodiment. Particularly, the S/D contact 130 is in direct contact with the silicide feature 128, which interfaces with the S/D feature 104 having SiGe alloy. The Ga-implanted layer 124 (having segregated Ga atoms) is disposed between the silicide feature 128 and the SiGe alloy. In an embodiment, there are some Ga contents in the silicide feature 128 too. However, the Ga concentration in the silicide feature 128 is much lower than that in the Ga-implanted layer 124. For example, the Ga concentration in the silicide feature 128 may be only about 5% to about 20% of that in the Ga-implanted layer 124. The total resistance in the S/D path (including the S/D contact 130, the silicide feature 128, the Ga-implanted layer 124, and the SiGe alloy in the S/D feature 104) is advantageously reduced by various aspects of the present disclosure including Ga ion implantation (the operation 16), the first annealing process (the operation 18), and the silicidation process (the operations 20-24).

In embodiments, the S/D contact 130 may include tungsten (W), cobalt (Co), copper (Cu), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In an embodiment, the etch mask 114 is removed before the deposition of the metallic material(s) for the S/D contact 130. Further, a CMP process may be performed to planarize a top surface of the device 100, remove excessive portions of the metallic material(s), and remove the etch mask 114 (if it has not been removed). The resulting structure is shown in FIGS. 11A and 11B.

The method 10 may perform further steps to complete the fabrication of the device 100. For example, it may perform various processes to form S/D contacts for n-type transistors, form gate contacts electrically coupled to the gate stacks 106, and form metal interconnects connecting the FinFETs as well as other portions of the device 100 to form a complete IC. Further, although the embodiments shown in FIGS. 2A-11B include fins 103 (therefore applicable to FinFETs), the present disclosure is not so limited, and the disclosed techniques can be applied to planar transistors or other types of multi-gate transistors for reducing S/D contact resistance in those transistors.

Although not intended to be limiting, one or more embodiments of the present disclosure provide many benefits to a semiconductor device and a formation process thereof. For example, embodiments of the present disclosure reduce source/drain (S/D) contact resistance by implanting gallium (Ga) ions into S/D features having silicon germanium (SiGe) alloy followed by a low-temperature annealing process. The Ge atomic concentration in the SiGe alloy is designed to increase Ga's solubility in the SiGe alloy and to reduce ion implantation defects therein. The low-temperature annealing process also removes defects in the SiGe alloy. Further, the provided subject matter can be readily integrated into existing IC fabrication flow and can be applied to many different process nodes.

In one exemplary aspect, the present disclosure is directed to a method. The method includes providing a structure that includes a substrate; a gate structure over the substrate; and a source/drain (S/D) feature including silicon germanium (SiGe) adjacent to the gate structure. The method further includes implanting gallium (Ga) into the S/D feature; performing a first annealing process at a first temperature to recrystallize the SiGe; depositing a conductive material including a metal over the S/D feature after the first annealing process; performing a second annealing process at a second temperature to cause reaction between the metal and the S/D feature; and performing a third annealing process at a third temperature to activate dopants including Ga in the S/D feature.

In an embodiment of the method, the third temperature is higher than the first and second temperatures. In another embodiment, the first temperature is in a range from about 400 degrees Celsius to about 600 degrees Celsius. In yet another embodiment, both the first and the second temperatures are in a range from about 400 degrees Celsius to about 600 degrees Celsius.

In some embodiment of the method, a ratio of Ge:Si in the SiGe is greater than 1. In an embodiment, Ge concentration in the SiGe ranges from about 55% to about 75%. In some embodiment, the implanting of Ga applies a Ga ion dose ranging from about $5E14$ cm$^{-2}$ to about $1E15$ cm$^{-2}$.

In an embodiment, the method further includes implanting boron (B) into the S/D feature simultaneously with the implanting of Ga. In another embodiment, after the second annealing process and before the third annealing process, the method further includes removing unreacted portions of the conductive material. In a further embodiment, after the third annealing process, the method further includes depositing another conductive material over the S/D feature.

In an embodiment, the metal includes titanium. In some embodiments, the gate structure includes a high-k dielectric layer and a metal gate electrode.

In another exemplary aspect, the present disclosure is directed to a method. The method includes providing a structure that includes a substrate; a gate structure over the substrate; a source/drain (S/D) feature including silicon germanium (SiGe) adjacent to the gate structure; and one or more dielectric layers over sidewalls of the gate structure and over the S/D feature. The method further includes etching the one or more dielectric layers to form an opening exposing the S/D feature; implanting gallium (Ga) ions into the S/D feature through the opening; and performing a first annealing process at a recrystallization temperature of the SiGe. The method further includes depositing a material including a metal over the S/D feature after the first annealing process; performing a second annealing process to form a compound having Si and the metal over the S/D feature; performing a third annealing process to activate dopants including Ga in the S/D feature; and forming an S/D contact plug over the compound.

In an embodiment of the method, the recrystallization temperature of the SiGe is in a range from about 525 degrees Celsius to about 575 degrees Celsius. In some embodiments, Ge concentration in the SiGe ranges from about 55% to about 75%. In some embodiments, the first annealing process causes Ga ions to segregate and to move to a top portion of the S/D feature. In some embodiments, the first and second annealing processes are performed at about a same temperature that is lower than a temperature of the third annealing process.

In yet another exemplary aspect, the present disclosure is directed to a method. The method includes providing a structure that includes a substrate; a high-k metal gate structure over the substrate; and a source/drain (S/D) feature including silicon germanium (SiGe) adjacent to the high-k metal gate structure. The method further includes implanting gallium (Ga) ions and boron (B) ions into the S/D feature and performing a first annealing process at a recrystallization temperature of the SiGe. The method further includes depositing a conductive material including a metal over the S/D feature after the first annealing process; performing a second annealing process to form one or more compounds having Si and the metal over the S/D feature; performing a third annealing process to activate dopants including Ga and B in the S/D feature; and forming an S/D contact plug over the one or more compounds.

In an embodiment of the method, Ge concentration in the SiGe ranges from about 55% to about 75%. In an embodiment, the third annealing process is performed at a temperature higher than the recrystallization temperature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a semiconductor fin extending from the substrate;
   a silicon germanium (SiGe) epitaxial feature disposed over the semiconductor fin;
   a gallium-implanted layer disposed over a top surface of the SiGe epitaxial feature; and
   a silicide feature disposed over and in contact with the gallium-implanted layer.

2. The semiconductor structure of claim 1, wherein the gallium-implanted layer and the silicide feature each includes gallium (Ga), and a Ga concentration in the silicide feature is about 5% to about 20% a Ga concentration in the gallium-implanted layer.

3. The semiconductor structure of claim 1, wherein the silicide feature includes one or more compounds having silicon and one or more metals having titanium, tantalum, nickel, platinum, ytterbium, iridium, erbium, cobalt, or a combination thereof.

4. The semiconductor structure of claim 1, wherein the SiGe epitaxial feature is doped with boron atoms, and the gallium-implanted layer blocks the boron atoms from reacting with the silicide feature.

5. The semiconductor structure of claim 1, wherein the gallium-implanted layer has a thickness about 6 nm to about 8 nm.

6. The semiconductor structure of claim 1, wherein the SiGe epitaxial feature includes more germanium than silicon by atomic concentration.

7. The semiconductor structure of claim 6, wherein a germanium concentration in the SiGe epitaxial feature ranges from about 55% to about 75%.

8. The semiconductor structure of claim 1,
wherein the SiGe epitaxial feature is doped with boron, indium, or both,
wherein the gallium-implanted layer includes SiGe and gallium,
wherein the silicide feature includes titanium silicide (TiSi), nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

9. A semiconductor structure, comprising:
a substrate;
a semiconductor fin extending from the substrate;
an epitaxial layer disposed over the semiconductor fin, wherein the epitaxial layer includes silicon germanium; and
a silicide feature over the epitaxial layer,
wherein the epitaxial layer includes gallium atoms at an interface between the epitaxial layer and the silicide feature.

10. The semiconductor structure of claim 9, further comprising a metal contact landing on the silicide feature.

11. The semiconductor structure of claim 9, wherein the epitaxial layer is doped with boron atoms, and the gallium atoms are segregated from and disposed over the boron atoms.

12. The semiconductor structure of claim 11, wherein the silicide feature includes titanium silicide, and the silicide feature is substantially free of Ti-B2 and Ti-Si-B compounds.

13. The semiconductor structure of claim 9, wherein the epitaxial layer includes a silicon germanium alloy, and the silicon germanium alloy has a germanium concentration greater than 50% but less than 90%.

14. The semiconductor structure of claim 9, wherein the silicide feature further includes gallium.

15. The semiconductor structure of claim 14, wherein there are more gallium atoms at the interface between the epitaxial layer and the silicide feature than in the silicide feature.

16. A semiconductor structure, comprising:
a substrate;
a semiconductor fin extending from the substrate;
an epitaxial layer grown on the semiconductor fin, wherein the epitaxial layer includes silicon germanium and boron;
a first layer over the epitaxial layer, wherein the first layer includes silicon germanium and gallium; and
a silicide feature over the first layer, wherein the silicide feature includes titanium silicide,
wherein the first layer functions to prevent boron atoms in the epitaxial layer from reacting with the titanium silicide in the silicide feature.

17. The semiconductor structure of claim 16, wherein the silicide feature includes gallium and a gallium concentration in the silicide feature is lower than a gallium concentration in the first layer.

18. The semiconductor structure of claim 16, wherein a ratio of germanium to silicon in the epitaxial layer is greater than 1.

19. The semiconductor structure of claim 18, wherein a germanium concentration in the epitaxial layer ranges from about 55% to about 75%.

20. The semiconductor structure of claim 16, wherein the gallium is in a top portion of the first layer.

* * * * *